(12) United States Patent
Shibata et al.

(10) Patent No.: US 7,737,553 B2
(45) Date of Patent: Jun. 15, 2010

(54) SEMICONDUCTOR DEVICE

(75) Inventors: Osamu Shibata, Nishinomiya (JP); Yoshiyuki Saito, Katano (JP)

(73) Assignee: Panasonic Corporation, Osaka (JP)

( * ) Notice: Subject to any disclaimer, the term of this patent is extended or adjusted under 35 U.S.C. 154(b) by 326 days.

(21) Appl. No.: 11/242,955

(22) Filed: Oct. 5, 2005

(65) Prior Publication Data
US 2006/0071320 A1    Apr. 6, 2006

(30) Foreign Application Priority Data
Oct. 6, 2004    (JP)    ............... 2004-293515

(51) Int. Cl.
*H01L 23/52*    (2006.01)
(52) U.S. Cl. .......... 257/734; 257/691; 257/773; 257/776; 257/784; 257/786; 257/E23.02; 257/E23.141; 257/E23.151; 228/180.5
(58) Field of Classification Search .......... 257/776, 257/E23.02, 734, 773, 786, 784, E23.141, 257/E23.151, 691; 228/180.5
See application file for complete search history.

(56) References Cited

U.S. PATENT DOCUMENTS

| | | | | |
|---|---|---|---|---|
| 5,587,607 A | * | 12/1996 | Yasuda et al. | 257/690 |
| 5,646,451 A | * | 7/1997 | Freyman et al. | 257/784 |
| 5,801,451 A | * | 9/1998 | Yamauchi | 257/786 |
| 5,838,072 A | * | 11/1998 | Li et al. | 257/786 |
| 5,986,345 A | * | 11/1999 | Monnot | 257/773 |
| 6,008,533 A | * | 12/1999 | Bruce et al. | 257/691 |
| 6,034,400 A | * | 3/2000 | Waggoner et al. | 257/355 |
| 6,097,098 A | * | 8/2000 | Ball | 257/786 |
| 6,121,690 A | * | 9/2000 | Yamada et al. | 257/784 |
| 6,351,040 B1 | * | 2/2002 | Schoenfeld | 257/784 |
| 6,380,635 B1 | * | 4/2002 | Manning et al. | 257/784 |
| 6,441,501 B1 | * | 8/2002 | Tseng et al. | 257/784 |
| 6,593,794 B2 | * | 7/2003 | Yue et al. | 327/310 |
| 6,762,507 B2 | * | 7/2004 | Cheng et al. | 257/786 |
| 6,930,381 B1 | * | 8/2005 | Cornelius | 257/692 |

FOREIGN PATENT DOCUMENTS

| | | |
|---|---|---|
| JP | 4-107940 | 4/1992 |
| JP | 2003-526901 | 9/2003 |
| WO | 00/51012 | 8/2000 |

* cited by examiner

*Primary Examiner*—Eugene Lee
*Assistant Examiner*—Peniel M Gumedzoe
(74) *Attorney, Agent, or Firm*—Wenderoth, Lind & Ponack, L.L.P.

(57) ABSTRACT

Fine-pitch first and second bonding pads are formed on a chip along its perimeter. The first bonding pads are formed at the peripheral parts on the chip, while the second bonding pads are formed inside the peripheral parts. An ESD protection circuit is connected to the first bonding pad, and an I/O circuit is connected to the second bonding pad. First and second bonding wires connect the first and second bonding pads to the same package pin, respectively. The second bonding wire is configured to be sufficiently longer than the first bonding wire, regardless of the pitch of the first bonding pads.

6 Claims, 9 Drawing Sheets ically used to connect signal lines, can be made larger than the upper number limit of the first bonding pads that can be arranged at the peripheral part of the chip.

SEMICONDUCTOR DEVICE

BACKGROUND OF THE INVENTION

1. Field of the Invention

The present invention relates to semiconductor devices, and in particular, relates to bonding between package pins and a chip.

2. Background Information

For electronic appliances in general, processing speeds keep further rising in order to meet demands for more functions and higher performances. In addition to that, further increases in speed are being required not only in communications between modules within an electronic appliance but also in communications between electronic appliances. Serial transmission has an advantage over parallel transmission in further increases in speed in communications. Accordingly, serial transmission schemes are now widely adopted by various standards, such as USB, IEEE1394, LVDS, DVI, HDMI, serial ATA, and PCI express. An increasing number of miniature electronic devices such as cellular phones, in particular, have adopted serial transmission schemes because of the advantage that a smaller number of signal lines are required.

Differential transmission schemes are usually adopted into serial transmission since its signal frequencies are extremely high, e.g. of the order of GHz, thereby reducing the influence of noises over signals and electromagnetic interference caused by signal transmissions. Impedance matching between signal lines and interfaces is required to be attained with further higher precision, in order to further improve transmission speeds of serial signals, in particular, in high frequency bands. Thus, reflections, distortions, and attenuation of signals at the interfaces should be further suppressed.

In conventional semiconductor devices, parasitic inductances and capacitances present in signal lines are reduced as much as possible, and thereby reflections, distortions, and attenuation of signals are suppressed. For example, inductances are mainly suppressed in conducting paths such as package pins and bonding wires, while capacitances of electrostatic discharge (ESD) protection circuits and input/output (I/O) circuits that are connected to bonding pads are mainly suppressed in a chip. However, it is difficult to attain the impedance matching between the signal lines and the I/O circuits with higher precision in the approach of only reducing the parasitic reactances (inductances/capacitances) of the signal lines. In addition, the reduction in capacitance prevents the ESD protection circuits from further improving reliability.

For example, the published PCT international application WO00051012 discloses a semiconductor device shown in FIG. 8, which is known as a conventional semiconductor device that can attain high-precision impedance matching between signal lines under the condition that high reliability of ESD protection circuits is maintained. An ESD protection circuit 107 and an I/O circuit 108 are connected to the same package pin 101 through different signal lines (sets of bonding pads 103, 104 and bonding wires 105, 106, respectively) in the semiconductor device 100. Furthermore, equivalent inductances L5 and L6 of the bonding wires 105 and 106 and the coupling coefficient k between them are adjusted, depending on the lengths of the bonding wires 105 and 106 and the angle between them. (See FIG. 9.) Thereby, the level vs of the signal that is received or sent by the I/O circuit 108 is maintained to be sufficiently high at up to a sufficiently high frequency band, while the capacitance C7 of the ESD protection circuit 107 is maintained to be sufficiently large.

For miniature electronic devices such as cellular phones, in particular, it is desirable to integrate a larger number and wider variety of modules into a single LSI in view of further miniaturization and power reduction. The number and variety of modules that can be integrated into a LSI of a fixed size are limited by the number of signal lines connectable to the LSI as well as the sizes of the modules. Accordingly, it is desirable that the largest possible number of signal lines are connectable to the LSI.

However, in the semiconductor device shown in FIG. 8, for example, the two bonding pads 103 and 104 to be connected to the same package pin 101 are arranged in parallel along an edge of the chip 102. Accordingly, the upper number limit of the package pins 101 connectable to the chip 102, that is, the upper number limit of the signal lines, is only half of the upper number limit of the bonding pads that can be arranged along the perimeter of the chip 102. Such a limitation on the number of signal lines is not desirable since it prevents increases in the number and variety of modules that can be integrated into the chip 102. Furthermore, the miniaturization of the chip 102 provides a finer pitch between the two bonding pads 103 and 104 arranged in parallel along an edge of the chips 102, and then, the difference in length and the angle between the bonding wires 105 and 106 can be adjusted within a narrower range. Accordingly, it is difficult to maintain the impedance matching between the I/O circuit 108 and the signal line 101-106-104 with sufficiently high precision under the condition that the capacitance of the ESD protection circuit 107 is maintained to be sufficiently large.

In view of the above, there exists a need for a semiconductor device which overcomes the above mentioned problems in the prior art. This invention addresses this need in the prior art as well as other needs, which will become apparent to those skilled in the art from this disclosure.

SUMMARY OF THE INVENTION

An object of the present invention is to provide a semiconductor device that can maintain impedance matching between I/O circuits and signal lines with further higher precision while maintaining sufficiently large capacitances of ESD protection circuits, and can secure a sufficiently large number of the signal lines connectable to its chip.

A semiconductor device according to the present invention comprises:

a plurality of package pins to be connected to external circuits;

a chip of a polygonal shape which includes a semiconductor integrated circuit;

a first bonding pad formed at a peripheral part of the chip;

a second bonding pad formed in a region on the chip located inside the peripheral part; and a signal line connecting one of the plurality of package pins to the first and second bonding pads.

At least two of the signal lines are connected to each of the package pins in this semiconductor device. In particular, by adjusting the distance between the first and second bonding pads, the signal line that connects between the package pin and the second bonding pad is provided with a higher impedance than the signal line that connects between the same package pin and the first bonding pad. Furthermore, the selection of the impedances has high flexibility. In particular, the difference in impedance between the two signal lines is not limited by the pitch of the first bonding pads. Accordingly, the first bonding pads can be arranged with a sufficiently fine pitch along the perimeter of the chip. As a result, the number of enabled package pins, or the package pins actually connected to the chip, can be matched with the upper number limit of the bonding pads that can be arranged along the perimeter of the chip. Thus, the number of the signal lines connectable to the chip are reliably maximized.

Preferably, the semiconductor integrated circuit includes an electrostatic discharge (ESD) protection circuit that is connected to the first bonding pad, and an input or output circuit that is connected to the second bonding pad. Further preferably, the signal line includes a first bonding wire that connects one of the plurality of the package pins directly to the first bonding pad, and a second bonding wire that connects the one of the package pins directly to the second bonding pad. Alternatively, the signal line may include a third bonding wire that connects the first bonding pad directly to the second bonding pad, in place of the second bonding wire.

The distance between the second bonding pad and the package pin to which the second bonding pad is connected is sufficiently larger than the distance between the first bonding pad and the package pin. In particular, the bonding wire (the second bonding wire or the combination of the first and third bonding wires) that connects between the second bonding pad and the package pin is sufficiently longer than the bonding wire (the first bonding wire) that connects between the first bonding pad and the package pin. Accordingly, the parasitic inductance in the signal line between the second bonding pad and the package pin is sufficiently higher than the parasitic inductance in the signal line between the first bonding pad and the package pin. Therefore, when an ESD causes an excessive surge voltage at one of the package pins, for example, the entailing surge current flows mainly through the first bonding pad to the ESD protection circuit. Thus, the input/output (I/O) circuit connected to the second bonding pad is reliably protected from malfunctions and destruction due to the ESD.

Furthermore, the parasitic inductance in the signal line between the second bonding pad and the package pin to which the second bonding pad is connected is provided independently of the parasitic inductance in the signal line between the first bonding pad and the package pin, and of the impedances of the circuits connected to the first bonding pad (in particular, the ESD protection circuit). Accordingly, the selection of the inductances has high flexibility. Therefore, high-precision impedance matching is attained between the package pin and the second bonding pad (furthermore, the I/O circuit connected to the second bonding pad), while the capacitance of the ESD protection circuit is maintained to be sufficiently high.

A signal line, in contrast to the above-described ones, may include a bonding wire that connects one of the plurality of the package pins directly to the first bonding pad, and an inductor that is connected between the first and second bonding pads, in a semiconductor device according to the present invention. The inductor is preferably a thin-film inductor. Because of the inductor, the signal line between the second bonding pad and the package pin can be provided with a further higher parasitic inductance than the signal line between the first bonding pad and the package pin. In other words, the selection of the inductances has further higher flexibility. Accordingly, the impedance matching between the package pin and the second bonding pad (furthermore, the I/O circuit connected to the second bonding pad) is attained with further higher precision. In addition, the above-described inductor can prevent normal-mode noises from entering the semiconductor integrated circuit through the signal line. Thereby, malfunctions and destruction of the I/O circuits and the following circuits due to the normal-mode noises are avoided.

Further preferably, two of the above-described inductors that are adjacent to each other magnetically couple to each other, and then, function as a common-mode filter. In that case, preferably, a pair of differential signals is transmitted through the two adjacent first bonding pads. The above-described common-mode filter prevents common-mode noises both from entering and leaving the I/O circuit through the signal line. As a result, malfunctions and destruction of the I/O circuits and the following circuits due to the common-mode noises are avoided, and in addition, electromagnetic interference from the signal lines, which is caused by the common-mode noises, is suppressed.

In a semiconductor device according to the present invention, as described above, at least two signal lines are connected to each package pin under the condition that the maximum number of the signal lines can be reliably connected to a chip. Furthermore, the signal lines can be provided with a sufficiently large difference in impedance, and in particular, the selection of the difference has high flexibility. As a result, regardless of further miniaturization of the chip, the impedance matching between the I/O circuit and the signal line is maintained with further higher precision, while the capacitance of the ESD protection circuit is maintained to be sufficiently large. Therefore, the semiconductor device according to the present invention, when installed in, in particular, miniature electronic devices such as cellular phones, can attain further more functionalities and further increases in speed in the signal transmission with high reliability maintained. In particular, when a serial interface is mounted, a common-mode filter can be constructed by the inductors that connect between the first and second bonding pads. Accordingly, the serial interface has high reliability, the effect of suppressing electromagnetic interference, and a further miniaturized size.

These and other objects, features, aspects and advantages of the present invention will become apparent to those skilled in the art from the following detailed description, which, taken in conjunction with the annexed drawings, discloses a preferred embodiment of the present invention.

BRIEF DESCRIPTION OF THE DRAWINGS

Referring now to the attached drawings which form a part of this original disclosure.

DETAILED DESCRIPTION OF THE PREFERRED EMBODIMENTS

Figure 1:
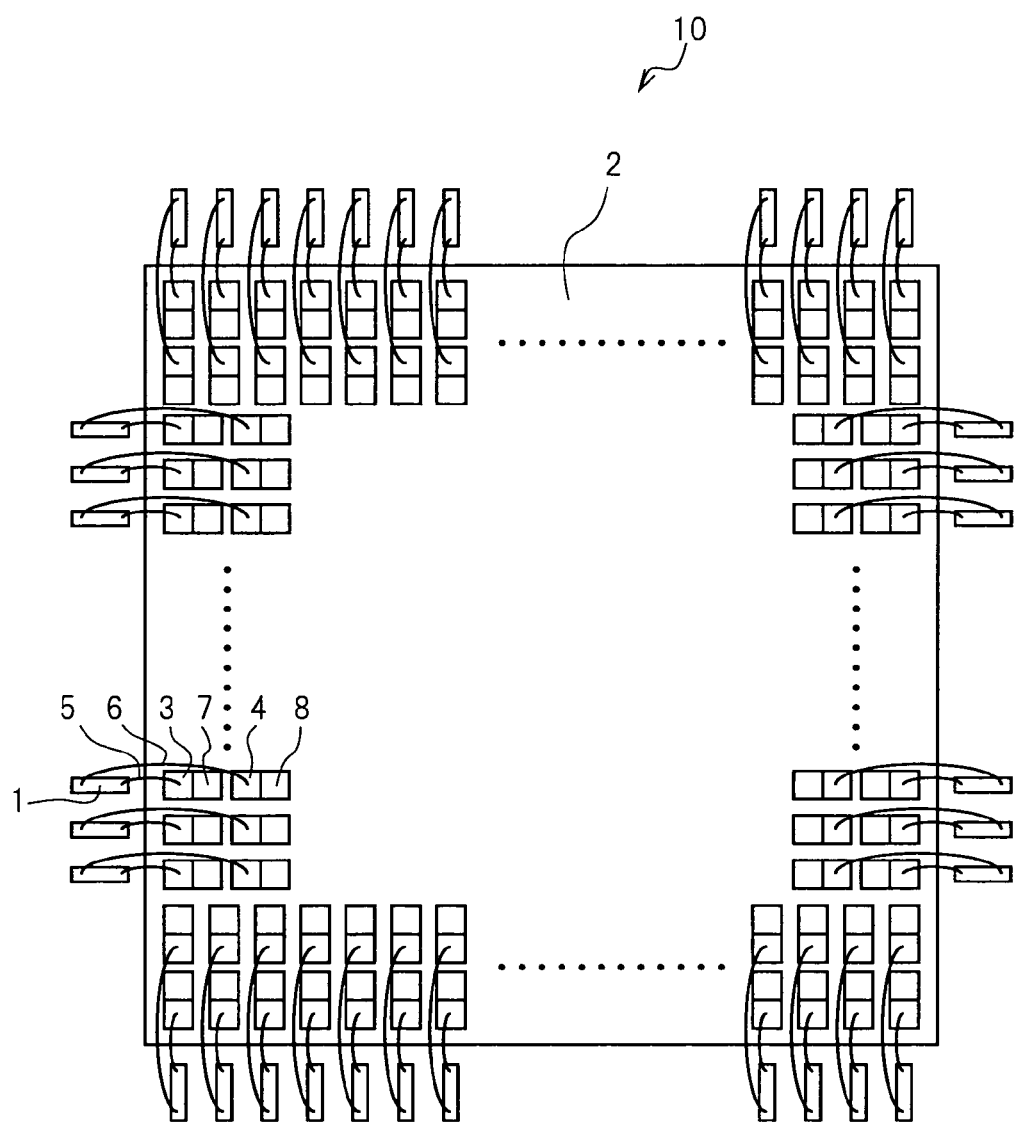
FIG. 1 is a plan view that shows a semiconductor device according to Embodiment 1 of the present invention.

The following describes the best embodiments of the present invention with referring to the figures.

Embodiment 1

A semiconductor device according to Embodiment 1 of the present invention is incorporated, preferably, into a miniature electronic device such as a cellular phone, and controls other circuits that are built into the same electronic device. The semiconductor device is connected to other circuits through the following components, and it communicates between the circuits. (See FIGS. 1, 2, and 3.) The semiconductor device 10 comprises a plurality of package pins 1, a chip 2, a first bonding pad 3, a second bonding pad 4, a first bonding wire 5, and a second bonding wire 6.

The package pins 1 are constructed from a conductive material, preferably metal. The plurality of package pins 1 are integrally molded, preferably, as a single lead frame. Each package pin 1 is further connected to external circuits.

The chip 2 is preferably a rectangular semiconductor substrate. The shape of the chip 2 may be a polygon other than a rectangle. A semiconductor integrated circuit (LSI) is included on the chip 2. The LSI preferably includes an ESD protection circuit 7 and an I/O circuit 8.

The first and second bonding pads 3 and 4 are both electrically conductive thin films, preferably, of the same shape/size, and further preferably, made of metal. The first and second bonding pads 3 and 4 are formed on the chip 2, preferably with a fixed pitch along the perimeter of the chip 2. The first bonding pads 3 are formed at the peripheral parts of the chip 2, while the second bonding pads 4 are formed inside the peripheral parts. Each of the first bonding pads 3 is paired with one of the second bonding pads 4 that is located at a predetermined distance. In particular, the pair of the first and second bonding pads 3 and 4 is arranged in parallel, preferably, in the direction that is perpendicular to the nearest edge of the perimeter of the chip 2. Alternatively, the pair of the first and second bonding pads may be arranged in parallel in an oblique direction with respect to the nearest edge of the perimeter of the chip 2.

Preferably, the ESD protection circuit 7 is connected to the first bonding pad 3 through a conducting path of the chip 2 (not shown). Preferably, the I/O circuit 8 is connected to the second bonding pad 4 through a conducting path of the chip 2 (not shown). The I/O circuit 8 includes one or both of a driver and a receiver.

Note that circuits other than the ESD protection circuit 7 may be connected to the first bonding pad 3. Furthermore, another ESD protection circuit 71 may be connected to the second bonding pad 4. (See FIG. 3.) Alternatively, more than one I/O circuit 8 may be connected to the same second bonding pad 4.

Preferably, the first bonding pads 3 are arranged with a fine pitch along the perimeter of the chip 2. Thereby, the number of enabled package pins 1, or the package pins 1 actually connected to the chip 2, can be matched with the upper number limit of the bonding pads that can be arranged along the perimeter of the chip 2. Thus, the number of signal lines connectable to the chip 2 is reliably maximized.

The first and second bonding wires 5 and 6 are both electrically conductive, extra-fine wires, and preferably made of gold (Au). The first bonding wire 5 connects the first bonding pad 3 directly to the package pin 1, and is used as a signal line between them. The second bonding wire 6 connects the second bonding pad 4 directly to the package pin 1, and is used as a signal line between them. Ends of the first and second bonding wires 5 and 6 are welded onto the first and second bonding pads 3, 4, and the package pin 1, preferably by using heat/ultrasonic waves.

The pair of the first and second bonding wires 5 and 6 that are connected to the adjacent pair of the first and second bonding pads 3 and 4 is preferably included in the same plane that is vertical to the surface of the chip 2. In that case, the second bonding wire 6 has sufficiently larger loop height than the first bonding wire 5. Alternatively, the plane that includes the second bonding wire 6 may deviate from the plane that includes the first bonding wire 5, and in particular, one of the planes may slant with respect to the other.

The second bonding pad 4 is located nearer the center of the chip 2 than the first bonding pad 3, and thus, the second bonding wire 6 can be provided with a sufficiently longer length than the first bonding wire 5. Furthermore, the range of the provided lengths is sufficiently wide, regardless of the pitch of the first bonding pads 3. On the other hand, a longer bonding wire has, in general, a higher parasitic inductance. Accordingly, the second bonding wire 6 can be provided with a sufficiently higher parasitic inductance than the first bonding wire 5. In particular, the range of the provided inductances is sufficiently wide, regardless of the pitch of the first bonding wires 5.

The second bonding wire 6 has a sufficiently higher parasitic inductance than the first bonding wire 5. Accordingly, when an ESD causes an excessive surge voltage at the package pin 1, for example, the entailed surge current flows mainly through the first bonding pad 3 to the ESD protection circuit 7. Thus, the I/O circuit 8 connected to the second bonding pad 4 is reliably protected from malfunctions and destruction caused by the ESD.

The parasitic inductance of the second bonding wire 6 are provided independently of the parasitic inductance of the first bonding wire 5 and the capacitance of the ESD protection circuit 7. In particular, the range of the provided inductances is sufficiently wide, regardless of the pitch of the first bonding pads 3. Accordingly, high-precision impedance matching is attained between the package pin 1, the second bonding wire 6, the second bonding pad 4, and the I/O circuit 8, while the capacitance of the ESD protection circuit 7 is maintained to be sufficiently large. As a result, reflections, distortions, and attenuation of signals can be sufficiently suppressed, and therefore, the LSI mounted on the chip 2 can communicate at further higher speed with the other circuits that are located at the outside of the semiconductor device 10.

Embodiment 2

Figure 2:
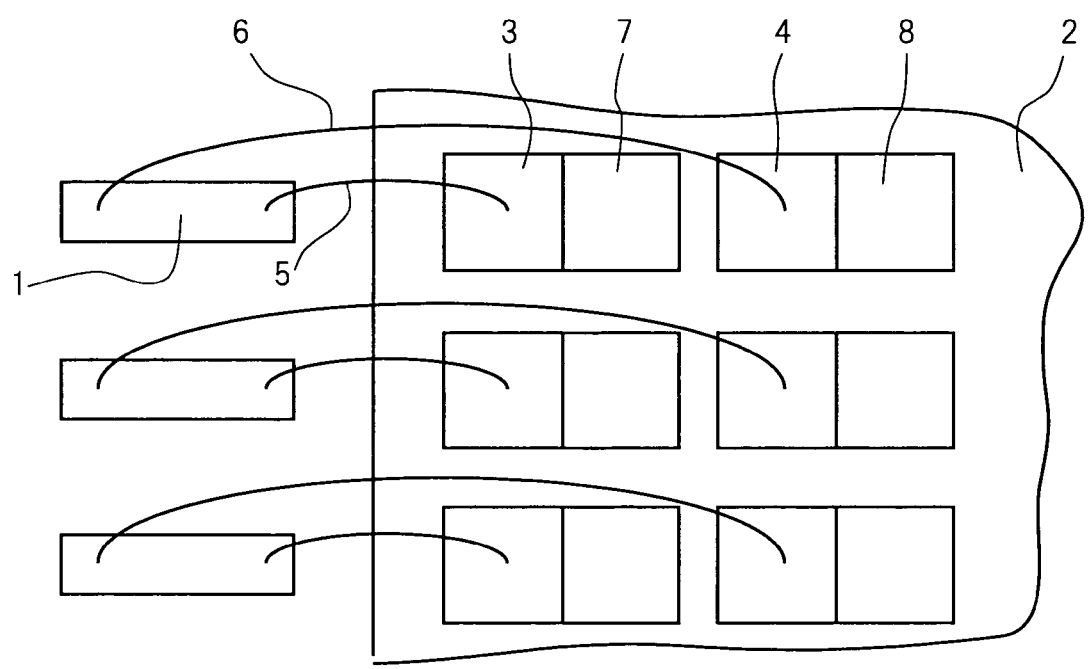
FIG. 2 is an enlarged view that shows a peripheral part of the semiconductor device shown in FIG. 1.
Figure 3:
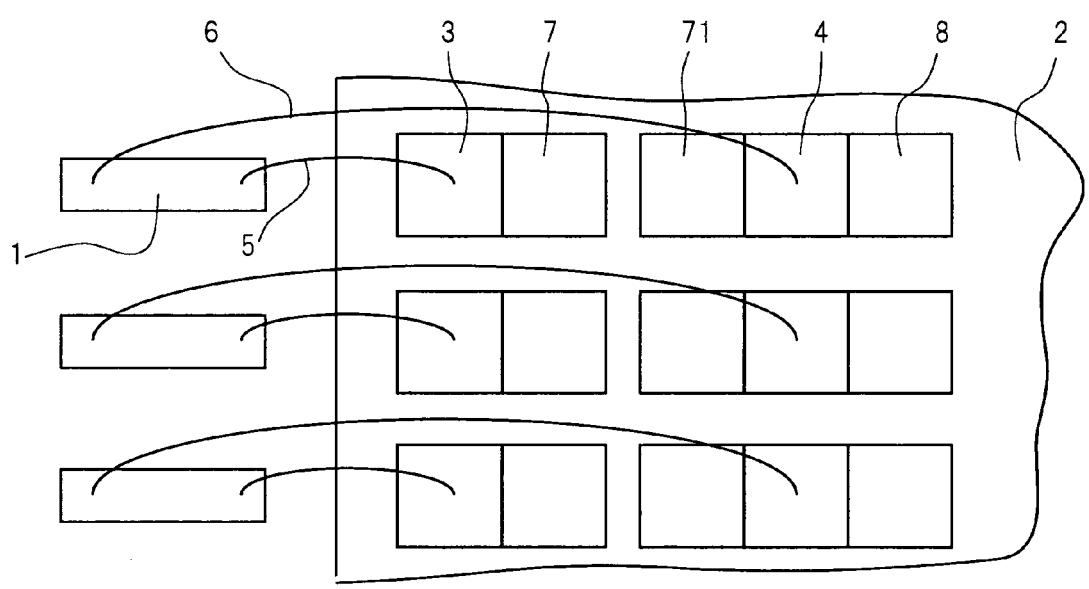
FIG. 3 is an enlarged view that shows another peripheral part of the semiconductor device shown in FIG. 1.
Figure 4:
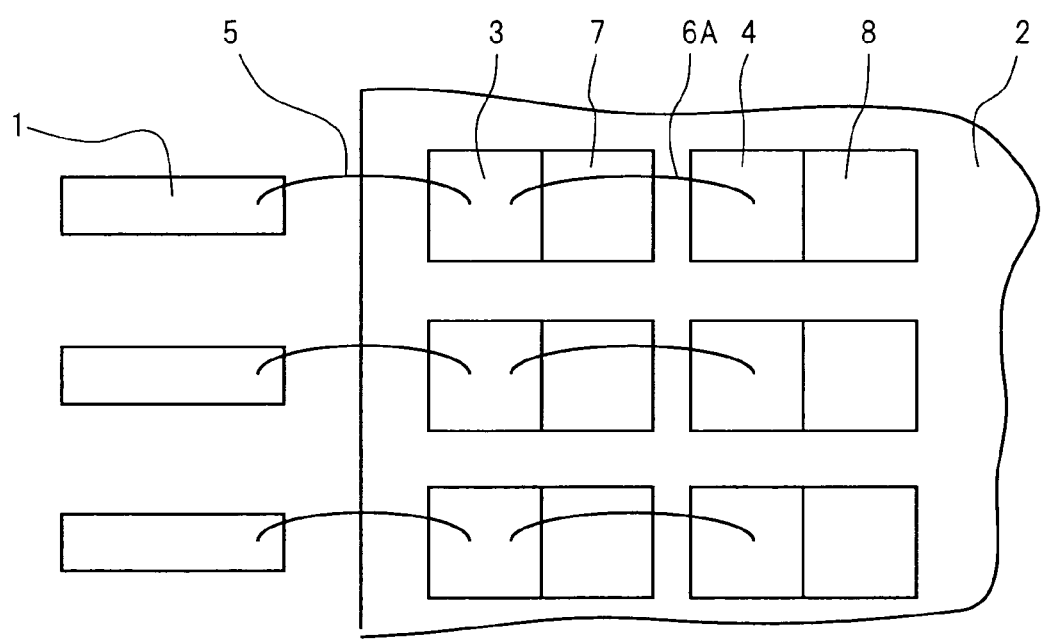
FIG. 4 is an enlarged view that shows a peripheral part of the semiconductor device according to Embodiment 2 of the present invention.
Figure 5:
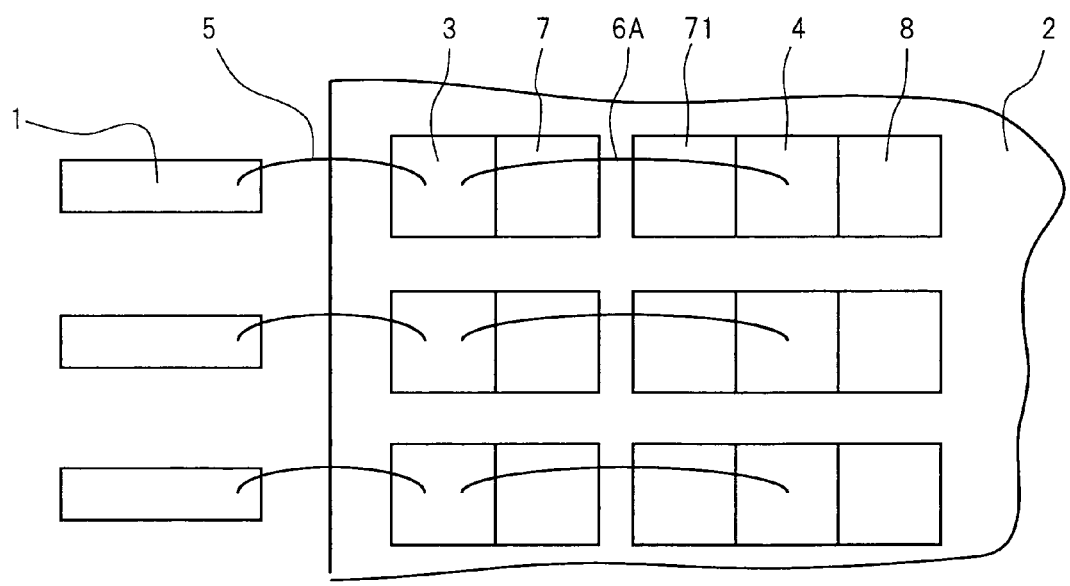
FIG. 5 is an enlarged view that shows another peripheral part of the semiconductor device according to Embodiment 2 of the present invention.

A semiconductor device according to Embodiment 2 of the present invention, similarly to the above-described semiconductor device according to Embodiment 1, is preferably incorporated into a miniature electronic device and controls other circuits that are built into the same electronic device. However, the semiconductor device according to Embodiment 2 is different from the semiconductor device according to Embodiment 1 since a third bonding wire connects directly between the first and second bonding pads in place of the second bonding wire. (See FIGS. 4 and 5.) In FIGS. 4 and 5, the components similar to the components shown in FIGS. 1-3 are marked with the same reference symbols as the reference symbols shown in FIGS. 1-3. Furthermore, a description of the details of the components that are similar to those found in Embodiment 1 can be found above in the description of Embodiment 1.

Preferably, the ESD protection circuit 7 is connected to the first bonding pad 3, while the I/O circuit 8 is connected to the second bonding pad 4. Note that circuits other than the ESD protection circuit 7 may be connected to the first bonding pad 3. Furthermore, another ESD protection circuit 71 may be connected to the second bonding pad 4. (See FIG. 5.) Alternatively, more than one I/O circuit 8 may be connected to the same second bonding pad 4.

The third bonding wire 6A is an electrically conductive, extra-fine wire and preferably, made of gold (Au). The third bonding wire 6A connects directly between adjacent pair of the first and second bonding pads 3 and 4, and is used as a signal line between them. Ends of the third bonding wire 6A are welded onto the first and second bonding pads 3 and 4, preferably using heat/ultrasonic waves.

The first and third bonding wires 5, 6A that corresponds to each other are preferably included in the same plane that is vertical to the surface of the chip 2. In other words, the first and third bonding wires 5, 6A are arranged in a virtually straight line in a fixed, preferably vertical, direction with respect to one edge of the perimeter of the chip 2. Alternatively, the plane that includes the third bonding wire 6A may deviate from the plane that includes the first bonding wire 5, and in particular, one of the planes may slant with respect to the other.

The second bonding pads 4 are located nearer the center of the chip 2 than the first bonding pads 3, and therefore, the length or parasitic inductance of the third bonding wire 6A can fall within a sufficiently wide range, regardless of the pitch of the first bonding pads 3. The third bonding wires 6A may be provided with as large a loop height as the first bonding wires 5, in sharp contrast to the second bonding wires 6 according to Embodiment 1. Accordingly, it is advantage in a further reduction of the height of the semiconductor device.

Only the parasitic inductance of the first bonding wire 5 exists between the package pin 1 and the first bonding pad 3. On the other hand, both parasitic inductances of the first and third bonding wires 5, 6A exist in series between the package pin 1 and the second bonding pad 4. Accordingly, when an ESD causes an excessive surge voltage at the package pin 1, for example, the entailed surge current flows mainly through the first bonding pad 3 to the ESD protection circuit 7. Thus, the I/O circuit 8 connected to the second bonding pad 4 is reliably protected from malfunctions and destruction due to the ESD.

The parasitic inductance of the third bonding wire 6A are provided independently of the parasitic inductance of the first bonding wire 5 and the capacitance of the ESD protection circuit 7. In particular, the range of the provided inductances is sufficiently wide, regardless of the pitch of the first bonding pads 3. Accordingly, high-precision impedance matching is attained between the package pin 1, the first bonding wire 5, the first bonding pad 3, the third bonding wire 6A, the second bonding pad 4, and the I/O circuit 8, while the capacitance of the ESD protection circuit 7 is maintained to be sufficiently large. As a result, reflections, distortions, and attenuation of signals can be sufficiently suppressed, and therefore, the LSI mounted on the chip 2 can communicate at further higher speed with the other circuits that are located at the outside of the semiconductor device 10.

Embodiment 3

Figure 6:
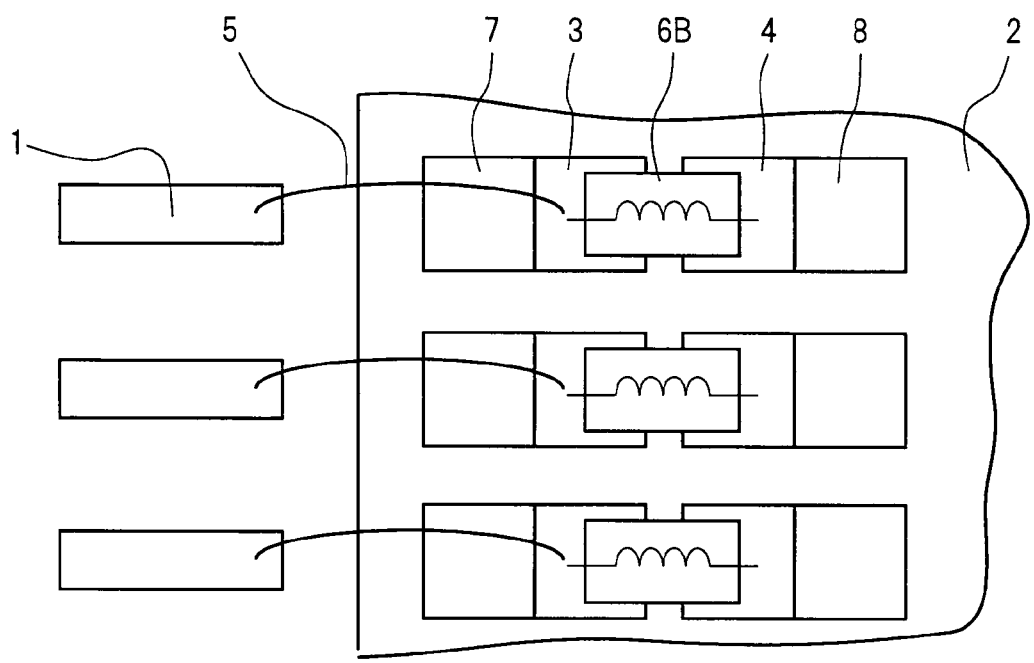
FIG. 6 is an enlarged view that shows a peripheral part of the semiconductor device according to Embodiment 3 of the present invention.

A semiconductor device according to Embodiment 3 of the present invention, similar to the above-described semiconductor device according to Embodiment 2, is preferably incorporated into a miniature electronic device and controls other circuits that are built into the same electronic device. However, the semiconductor device according to Embodiment 3 is different from the semiconductor device according to Embodiment 2 since an inductor connects between the first and second bonding pads in place of the third bonding wire. (See FIG. 6.) In FIG. 6, the components similar to the components shown in FIGS. 4 and 5 are marked with the same reference symbols as the reference symbols shown in FIGS. 4 and 5. Furthermore, a description of the details of the components that are similar to those found in Embodiment 2 can be found above in the description of Embodiment 2.

The inductor 6B is, preferably, of a thin-film type, and in particular, is of a rectangular shape, or alternatively, may be of a laminated type. The inductor 6B connects between adjacent pair of the first and second bonding pads 3 and 4, and is used as a signal line between them, in particular, under a single-ended transmission scheme. The inductor 6B, further preferably, functions as a normal-mode filter, and eliminates from the signal line, normal-mode noises of frequencies beyond a signal band. Preferably, the inductor 6B is narrower in the edge direction of the chip 2 than the first bonding pad 3. Accordingly, the first bonding pads 3 can be formed with a sufficiently fine pitch along the perimeter of the chip 2.

The parasitic inductance of the first bonding wire 5 takes the greater part of the parasitic inductance between the package pin 1 and the first bonding pad 3. On the other hand, the inductor 6B is connected in series between the package pin 1 and the second bonding pad 4 in addition to the parasitic inductance of the first bonding wire 5. Accordingly, when an ESD causes an excessive surge voltage at the package pin 1, for example, the entailed surge current flows mainly through the first bonding pad 3 to the ESD protection circuit 7. Thus, the I/O circuit 8 connected to the second bonding pad 4 is reliably protected from malfunctions and destruction caused by the ESD.

The inductance of the inductor 6B is provided independently of the parasitic inductance of the first bonding wire 5 and the capacitance of the ESD protection circuit 7. In particular, the range of the provided inductances is sufficiently wide, regardless of the pitch of the first bonding pads 3. Accordingly, high-precision impedance matching is attained between the package pin 1, the first bonding wire 5, the first bonding pad 3, the inductor 6B, the second bonding pad 4, and the I/O circuit 8, while the capacitance of the ESD protection circuit 7 is maintained to be sufficiently large. As a result, reflections, distortions, and attenuation of signals can be sufficiently suppressed, and therefore, the LSI mounted on the chip 2 can communicate at further higher speed with the other circuits that are located at the outside of the semiconductor device 10.

Embodiment 4

Figure 7:
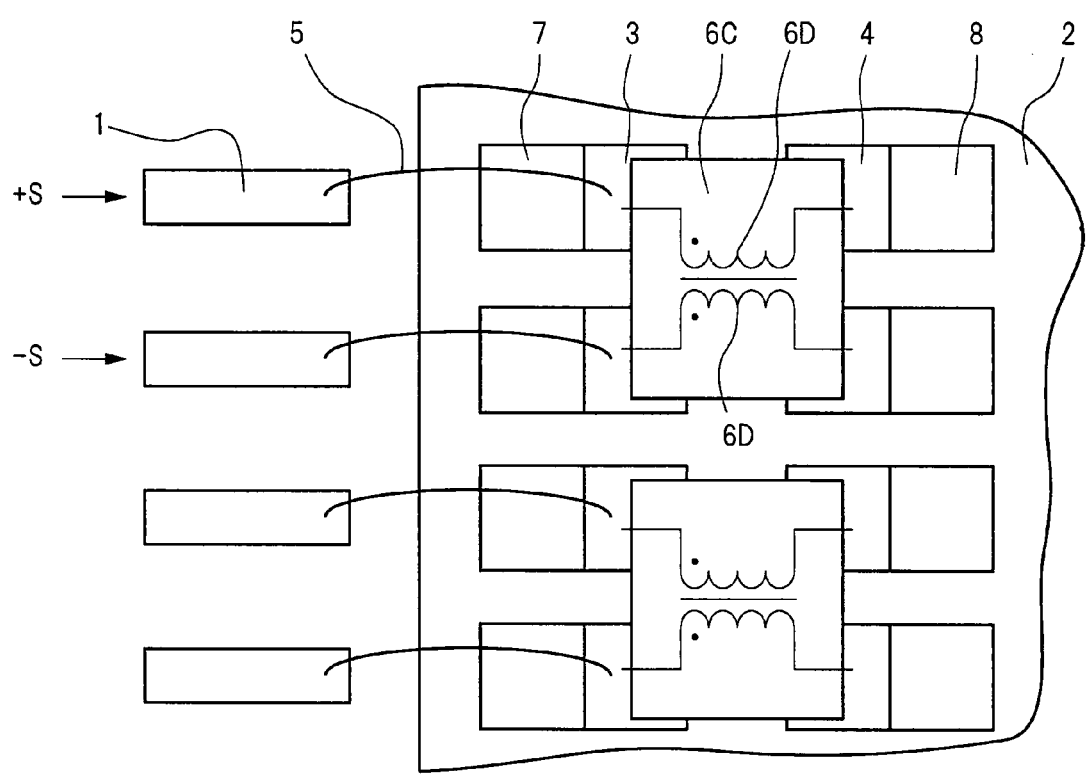
FIG. 7 is an enlarged view that shows a peripheral part of the semiconductor device according to Embodiment 4 of the present invention.
Figure 8:
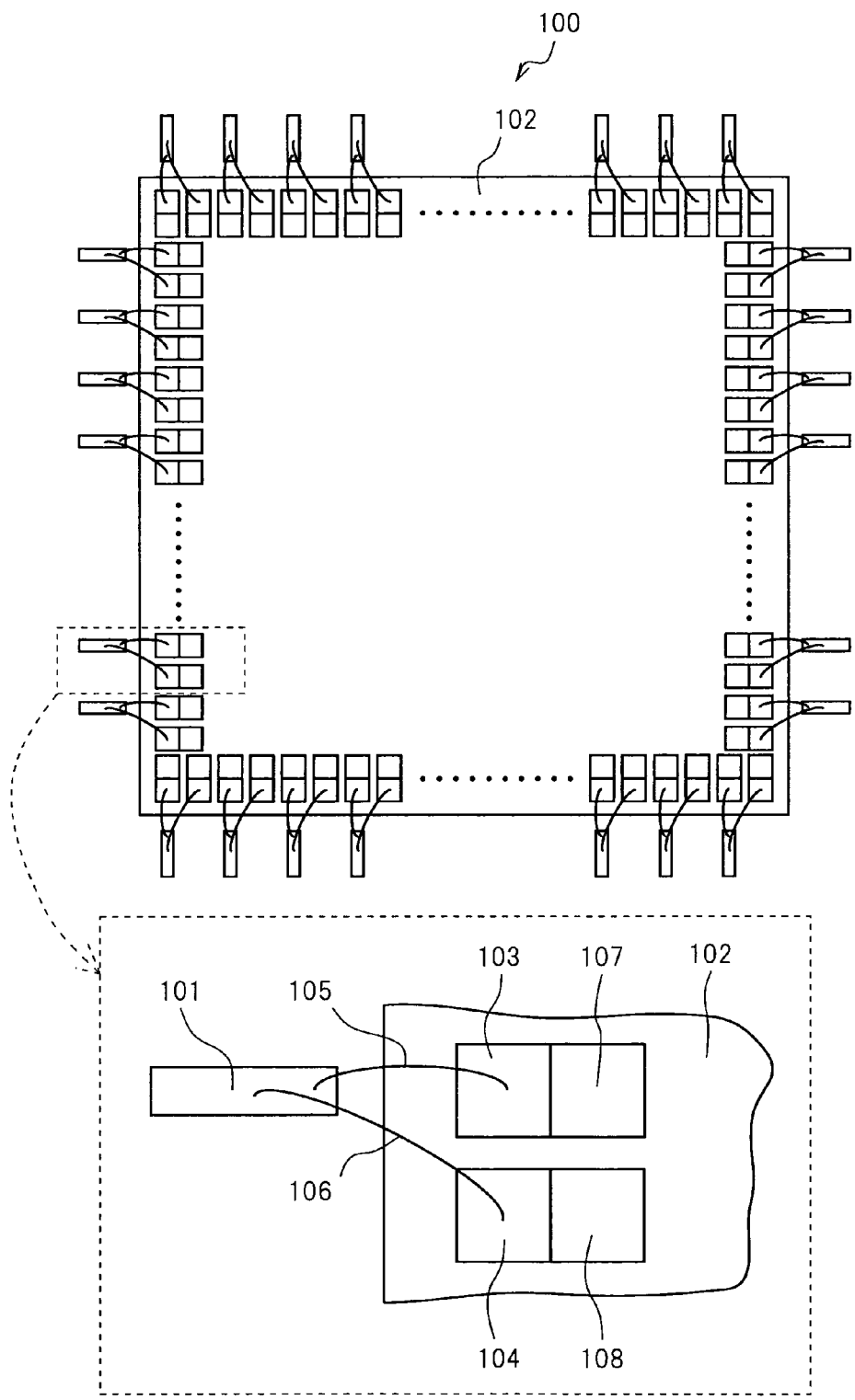
FIG. 8 is a plan view that shows a conventional semiconductor device and an enlarged view that shows a peripheral part of the semiconductor device.
Figure 9:
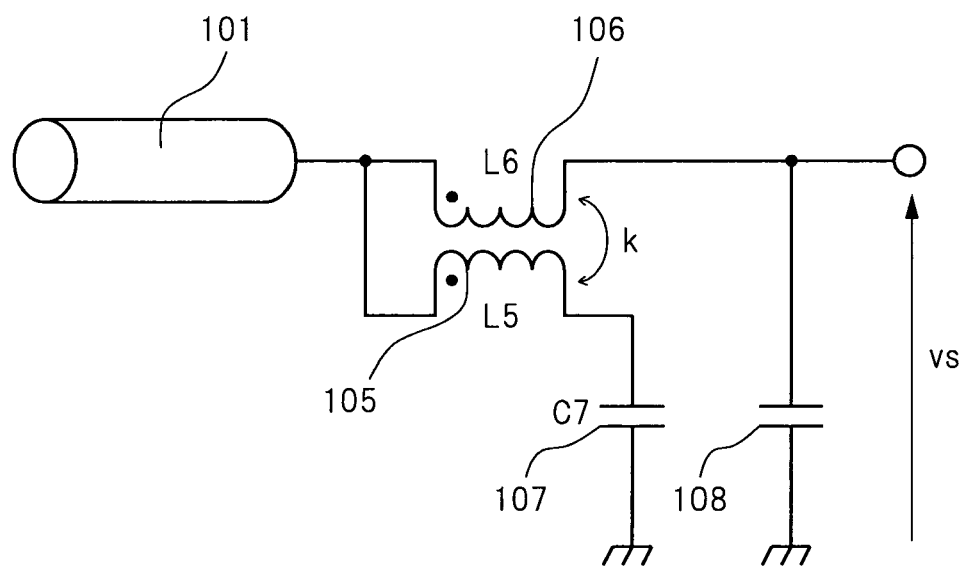
FIG. 9 shows an equivalent circuit of the part shown in the enlarged view of FIG. 8.

A semiconductor device according to Embodiment 4 of the present invention, similarly to the above-described semiconductor device according to Embodiment 3, is preferably incorporated into a miniature electronic device and controls other circuits that are built into the same electronic device. However, the semiconductor device according to Embodiment 4 is different from the semiconductor device according to Embodiment 3 since adjacent two inductors magnetically couple to each other, and thereby constitute a common-mode filter. (See FIG. 7.) In FIG. 7, the components similar to the components shown in FIG. 6 are marked with the same reference symbols as the reference symbols shown in FIG. 6. Furthermore, a description of the details of the components that are similar to those found in Embodiment 3 can be found above in the description of Embodiment 3.

The common-mode filter 6C comprises two inductors 6D. The two inductors 6D are each of a thin-film type, and preferably, of a rectangular shape, or alternatively, may be of a laminated type. The two inductors 6D are separately included in adjacent two signal lines 1-5-3-6D-4, are preferably laminated on the same substrate, and are magnetically coupled to each other. Thereby, the common-mode filter 6C has a high common-mode impedance and a low differential impedance.

The two signal lines 1-5-3-6D-4 that couple to each other through the common mode filter 6C are used as signal lines under a differential transmission scheme. In other words, through the two signal lines 1-5-3-6D-4, a pair of differential signals +S and −S are transmitted, which are of opposite phases and of the same waveform/frequency. When common-mode noises are applied from the outside of two package pins 1 that are included in the two signal lines, the common-mode filter 6C only reflects the common-mode noises to the signal line without causing distortions and attenuation of the differential signal pair +S, −S, and thereby prevents the common-mode noises from entering the I/O circuit 8 from the package pins 1. As a result, malfunctions and destruction of the I/O circuit 8 caused by the common-mode noises are avoided. Conversely, when common-mode noises are sent from the I/O circuit 8 to the second bonding pads 4, the common-mode filter 6C reflects the common-mode noises to the I/O circuit 8, and thereby prevents the common-mode noises from escaping out of the package pin 1. As a result, electromagnetic interference from the signal lines caused by the common-mode noises is suppressed.

Note that a component for preventing the reflection of the common-mode noises (e.g., a series connection of two impedance elements with a grounded center node) may be further added to the common-mode filter 6C. Thereby, electromagnetic interference caused by the reflected common-mode noises is suppressed.

The second bonding pads are formed inside the peripheral parts of the chip where the first bonding pads are included, in the above-described semiconductor devices according to Embodiments 1-4 of the present invention. Alternatively, other bonding pads may be formed further inside the region on the chip where the second bonding pads are included, and may be connected to the package pins in a similar manner of the second bonding pads. In other words, three and more bonding pads may be arranged in parallel in an inward direction from the peripheral part of the chip, and may be connected to the same package pin. In that case, the three and more bonding pads are, preferably, arranged in parallel in a fixed, in particular vertical, direction with respect to one edge of the perimeter of the chip. Alternatively, with respect to one of the first bonding pads located at the peripheral part of the chip, the other corresponding, two bonding pads may be arranged in different directions.

The present invention relates to semiconductor devices, and in particular, adds the above-described concept to the bonding between package pins and chip. Thus, the present invention clearly has industrial applicability.

This application claims priority to Japanese Patent Application No. 2004-293515. The entire disclosure of Japanese Patent Application No. 2004-293515 is hereby incorporated herein by reference.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing description of the embodiments according to the present invention is provided for illustration only, and not for the purpose of limiting the invention as defined by the appended claims and their equivalents.

What is claimed is:

1. A semiconductor device, comprising:
a plurality of package pins to be connected to external circuits, said package pins including a first package pin;
a chip of a polygonal shape which includes a semiconductor integrated circuit;
a first bonding pad formed at a peripheral part of said chip;
a second bonding pad formed in a region on said chip inside said peripheral part; and
a signal line connecting one of said plurality of package pins to said first and second bonding pads, said signal line including a first bonding wire which connects said first package pin directly to said first bonding pad, and a second bonding wire which directly connects said first package pin connected to said first bonding wire to said second bonding pad, said second bonding wire being longer than said first bonding wire,
said first bonding pad being arranged between said second bonding pad and said first package pin,
said first bonding pad, said second bonding pad, and said first package pin being aligned.

2. The semiconductor device according to claim 1, further comprising an electrostatic discharge protection circuit connected to said first bonding pad, and an input or output circuit connected to said second bonding pad.

3. The semiconductor device according to claim 2, wherein said electrostatic discharge protection circuit is arranged on a second bonding pad side of said first bonding pad.

4. The semiconductor device according to claim 2, wherein said input or output circuit is arranged on the opposite side of said second boding pad from said first bonding pad.

5. The semiconductor device according to claim 2, further comprising a second electrostatic discharge protection circuit connected to said second bonding pad.

6. The semiconductor device according to claim 5, wherein said second electrostatic discharge protection circuit is arranged on a first bonding pad side of said second bonding pad.

* * * * *